United States Patent [19]
Endo et al.

[11] Patent Number: 5,971,696
[45] Date of Patent: Oct. 26, 1999

[54] SYSTEM FOR CARRYING-IN OF CASSETTE FOR SUBSTRATES TO BE PROCESSED

[75] Inventors: Tamio Endo, Inagi; Yoshiyuki Harima, Zushi, both of Japan

[73] Assignee: Tokyo Electron Limited, Tokyo-to, Japan

[21] Appl. No.: 08/937,593

[22] Filed: Sep. 29, 1997

[30] Foreign Application Priority Data

Oct. 1, 1996  [JP]  Japan ................................ 8-280256

[51] Int. Cl.⁶ .................................................. B65G 21/00
[52] U.S. Cl. ...................... 414/778; 414/433; 414/217; 414/936; 414/940
[58] Field of Search ................................ 414/217, 778, 414/939, 940, 936, 938, 948, 433; 198/409, 412

[56] References Cited

U.S. PATENT DOCUMENTS

| | | | |
|---|---|---|---|
| 5,048,164 | 9/1991 | Harima ..................... | 414/940 |
| 5,181,819 | 1/1993 | Sakata et al. ............. | 414/939 |
| 5,183,378 | 2/1993 | Asano et al. .............. | 414/433 |
| 5,186,594 | 2/1993 | Toshima et al. . | |
| 5,273,423 | 12/1993 | Shiraiwa . | |
| 5,303,671 | 4/1994 | Kondo et al. . | |
| 5,443,348 | 8/1995 | Biche et al. .............. | 414/940 |
| 5,468,112 | 11/1995 | Ishii et al. ................ | 414/217 |
| 5,507,614 | 4/1996 | Leonov et al. ........... | 414/940 |
| 5,664,926 | 9/1997 | Sussman et al. .......... | 414/778 |
| 5,664,927 | 9/1997 | Takeuchi ................... | 414/940 |
| 5,715,929 | 2/1998 | Scheler et al. ........... | 198/409 |
| 5,769,588 | 6/1998 | Toshima et al. .......... | 414/217 |

Primary Examiner—Christopher P. Ellis
Assistant Examiner—Douglas Hess

[57] ABSTRACT

There is provided a cassette carrying-in system, which can rotate a cassette housing therein substrates to be treated so that the substrates are changed from a vertical state to a horizontal state and which can carry the cassette in, e.g., a load-lock chamber of a vacuum processing unit. The cassette carrying-in system is provided for carrying a cassette, in which a plurality of substrates to be processed are arranged in parallel, in a processing unit for treating the substrates. The cassette carrying-in system comprises: a moving body having a first supporting portion for holding a bottom portion of the cassette so that the substrates to be processed are arranged vertically, and a second supporting portion, which is rotatable with the first supporting portion and which supports thereon a side of the cassette when the cassette is inclined, the second supporting portion supporting thereon the side serving as a bottom of the cassette when the substrates to be processed are arranged horizontally; a rotating mechanism for rotating the first and second supporting portions so that the substrates in the cassette are changed between a vertical state and a horizontal state; and a running mechanism for running the moving body so that the cassette supported on the first and second supporting portions moves between inside and outside the processing unit.

16 Claims, 11 Drawing Sheets

Prior Art

FIG.13

SYSTEM FOR CARRYING-IN OF CASSETTE FOR SUBSTRATES TO BE PROCESSED

BACKGROUND OF THE INVENTION

1. Field of the Invention

The present invention relates generally to a system for the carrying-in of a cassette for substrates to be processed. More specifically, the invention relates to a system for carrying, e.g., a wafer cassette, which holds therein a plurality of semiconductor wafers, in a processing unit, e.g., a load-lock chamber of a vacuum processing unit.

2. Description of the Prior Art

Semiconductor fabrication processes include vacuum processings, such as etching, thin film deposition, ashing and sputtering. In recent years, a single wafer vacuum processing unit called a cluster tool, which increases throughput by connecting a plurality of vacuum processing chambers and cassette chambers to a common transfer chamber, has been made fit for practical use.

Figure 11:
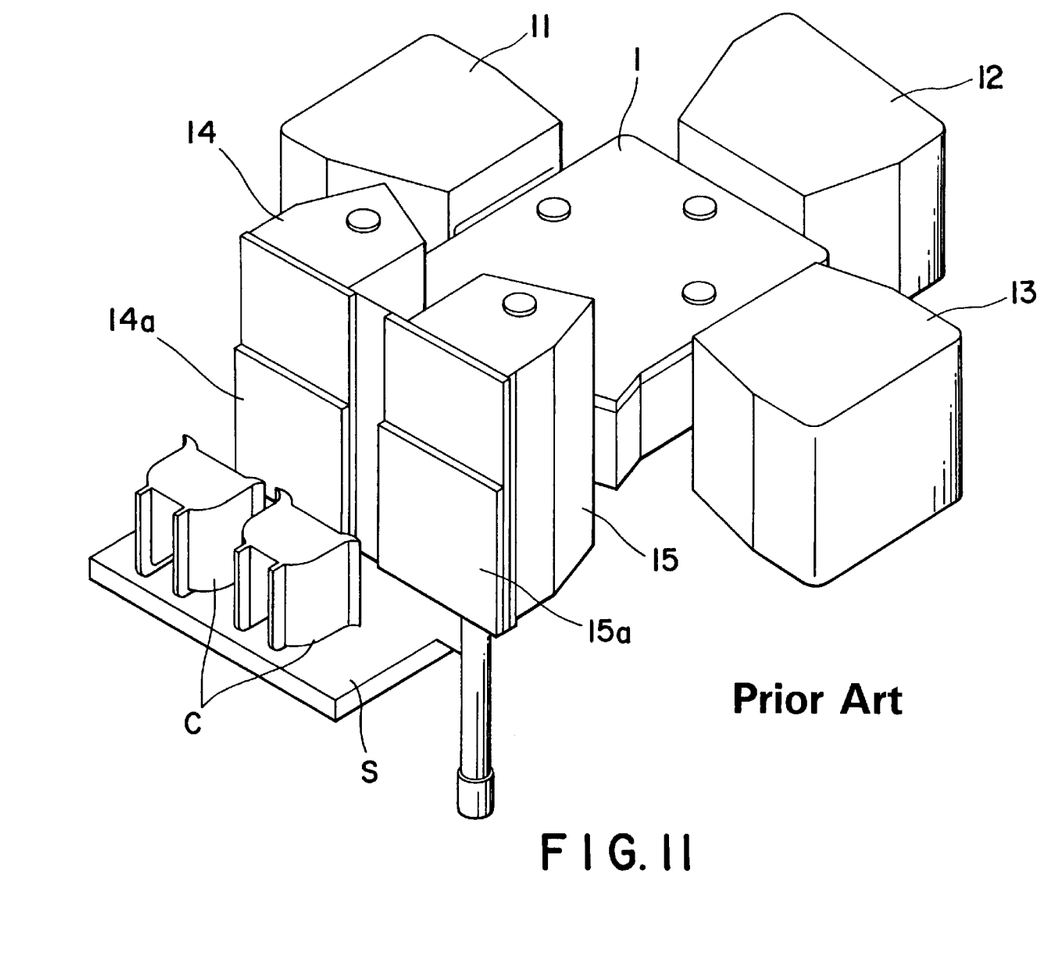
FIG. 11 is a schematic perspective view of a conventional wafer cassette transfer system with a vacuum processing unit.

FIG. 11 shows a conventional vacuum processing unit of this type. In FIG. 11, reference number 1 denotes a transfer chamber, and reference numbers 11 through 13 denote vacuum processing chambers. In addition, reference numbers 14 and 15 denote cassette chambers serving as load-lock chambers, and S denotes a cassette stage. In this system, an operator sets a wafer cassette (which will be hereinafter simply referred to as a "cassette") C, which houses therein, e.g., 25 wafers, on the cassette stage S so that the wafers are arranged horizontally (or substantially horizontally). Then, while the attitude of the cassette C is maintained, the cassette C is carried in the cassette chamber 14 or 15 by means of a transfer arm (not shown) provided between the cassette C and the cassette chamber 14 or 15. Thereafter, the wafers in the cassette chamber 14 or 15 are carried in the vacuum chamber 11, 12 or 13 by means of a transfer arm (not shown) provided in the transfer chamber 1, and a predetermined vacuum processing is carried out therein.

Figure 12A:
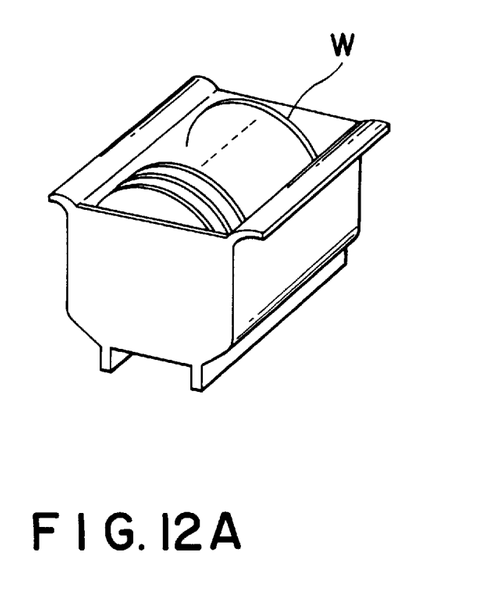
FIG. 12A is a perspective view of a wafer cassette, in which a plurality of wafers W are vertically arranged in parallel.
Figure 12B:
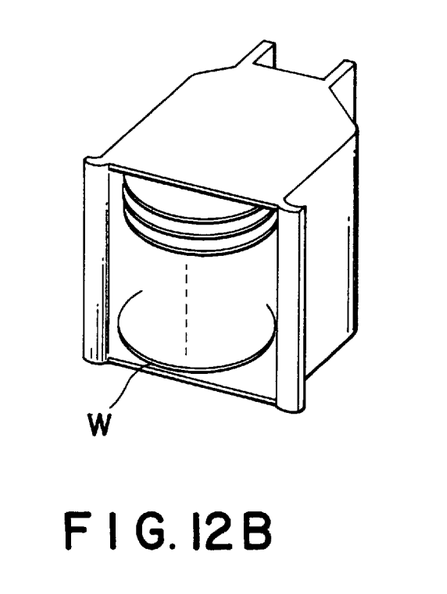
FIG. 12B is a perspective view of a wafer cassette, in which a plurality of wafers W are horizontally arranged in parallel.

As shown in FIG. 12A, the cassette C is a container of a resin for holding therein a plurality of wafers W which are arranged vertically in parallel. The cassette C has an opening on the upper side for taking the wafers in and out. The inner wall of the cassette C is formed with a plurality of slots for receiving therein the edges of the wafers W. It is required to set the cassette C in the cassette chamber 14 or 15 so that the transfer arm in the transfer chamber 1 can access to the wafers W in the cassette C, i.e., so that the wafers W are arranged substantially horizontally as shown in FIG. 12B and the opening faces the transfer chamber 1. Therefore, in the cassette stage S outside the cassette chambers 14 and 15, the wafers W must be horizontally arranged and the opening must face doors 14a and 15a of the cassette chambers 14 and 15.

Since the operator carries the cassette while the wafers W are arranged horizontally, the operator must turn its wrist to the front by about 90 degrees while holding the cassette C. However, the cassette C housing therein 25 wafers is very heavy, e.g., about 4 kg when the size of the wafer is 8 inches, and greater than 10 kg when the size of the wafer is 12 inches. Therefore, this operation is an undesired human engineering operation since excessive load is applied to the operator's wrist.

Figure 13:
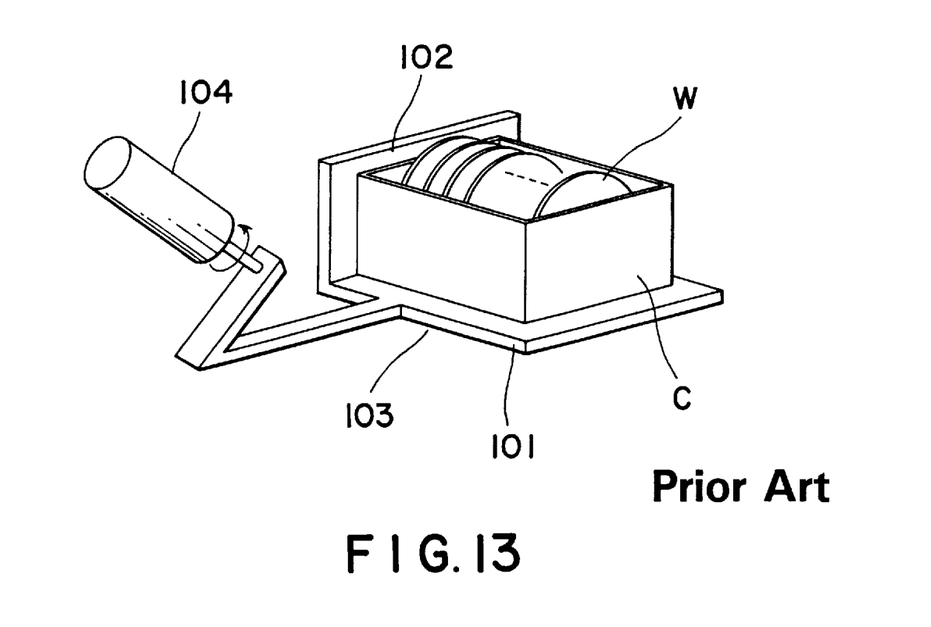
FIG. 13 is a perspective view of a conventional cassette holder for changing the attitude of a wafer cassette.

As an example of technique for rotating the cassette C, U.S. Pat. No. 5,507,614 disclosed a cassette holder mechanism, which is schematically shown in FIG. 13. As schematically shown in FIG. 13, a L-shaped member 103 has two supporting surfaces 101 and 102, which are perpendicular to each other. A cassette C is mounted on one of the supporting surfaces 101 and 102 of the L-shaped member 103. The L-shaped member 103 is rotated by about 90 degrees by means of a motor 104 to rotate the cassette C.

If this cassette holder is arranged on the cassette stage S, it is not required to turn the operator's wrist. In this case, since it may be required to provide a cassette holder mechanism in addition to the transfer arm for carrying the cassette C in and out of the cassette chamber 14 or 15, an expensive transfer mechanism may be required. Therefore, it is considered that the cassette holder mechanism is combined with the doors 14a and 15a of the cassette chambers 14 and 15, i.e., the supporting surfaces of the cassette holder mechanism are also used as the doors, so that after the cassette C is mounted on the supporting surfaces, the L-shaped member is rotates so as to cause the cassette C to rise at the same time that the cassette C is carried in the cassette chamber 14 or 15.

However, with this construction, since the driving portion of the cassette holder mechanism is introduced into the cassette chamber, there are problems of contamination due to particle and contamination due to lubricating oil. In addition, an O-ring serving as a sealing material is provided between the door 14a or 15a and the edge portion of the carrying-in port of the cassette chamber 14 or 15, and the O-ring is deformed and the door 14a or 15a is drawn when the cassette chamber 14 or 15 is evacuated after the door 14a or 15a is closed. In view of this point, the mechanism is complicated. Moreover, in generally, clean air always flows from the top to prevent particle contamination even if the cassette C is supported on the supporting surface 101. However, since the supporting surface 101 also serves as a door and is a plate, it is difficult to flow the clean air as a laminar flow. Therefore, it is not desired that the cassette holder means is combined with the doors 14a and 15a of the cassette chambers 14 and 15.

SUMMARY OF THE INVENTION

It is therefore an object of the present invention to eliminate the aforementioned problems and to provide a system for the carrying-in of a cassette for substrates to be processed, which van relieve the operator's work load.

It is another object of the present invention to provide a system for the carrying-in of a cassette for substrates to be processed, which allows the rotation and the forward and backward movements of a cassette by a single shaft and which has a simple structure.

In order to accomplish the aforementioned and other objects, according to one aspect of the present invention, there is provided a cassette carrying-in system for carrying a cassette, in which a plurality of substrates to be processed are arranged in parallel, in a processing unit for treating the substrates, the cassette carrying-in system comprising: a moving body having a first supporting portion for holding a bottom portion of the cassette so that the substrates to be processed are arranged vertically, and a second supporting portion, which is rotatable with the first supporting portion and which supports thereon a side of the cassette when the cassette is inclined, the second supporting portion supporting thereon the side serving as a bottom of the cassette when the substrates to be processed are arranged horizontally; a rotating mechanism for rotating the first and second supporting portions so that the substrates in the cassette are changed between a vertical state and a horizontal state; and a running mechanism for running the moving body so that the cassette supported on the first and second supporting portions moves between inside and outside the processing unit.

The rotating mechanism may comprise a rotating shaft for rotating the first and second supporting portions and a driving shaft for rotating the rotating shaft, and the running mechanism may comprise a rotating body which rolls on a guiding track to run the moving body. In this case, the rotation of the driving shaft may be transmitted to the rotating shaft of the rotating mechanism and a rotating shaft of the rotating body in that order.

The cassette carrying-in system may further comprise a first cam mechanism for transmitting the rotation of the driving shaft to the rotating shaft of the rotating body of the rotating mechanism, and a second cam mechanism for transmitting the rotation of the driving shaft to the rotating shaft of the running mechanism. In this case, the rotation timings of the rotating shafts may be set by the first and second cam mechanisms.

The processing unit may be a vacuum processing unit, which comprises a vacuum processing chamber for vacuum-processing the substrates to be processed, and a load-lock chamber provided between the vacuum processing chamber and the outside. In this case, the cassette is carried in the load-lock chamber from the outside. In addition, the processing unit may have a mounting plate, which is movable upwards and downwards and which is provided in the load-lock chamber.

According to the present invention, the cassette can be rotated so that the substrates to be processed are changed from a vertical state to a horizontal state, and the cassette can be carried in, e.g., the load-lock chamber of the vacuum processing unit, so that it is possible to relieve the operator's work load.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, particularly to FIGS. 1 through 7, the first preferred embodiment of a system for the carrying-in of a cassette for substrates to be processed, according to the present invention, which is applied to a processing unit, e.g., a vacuum processing unit called a cluster tool, will be described below.

Figure 1:
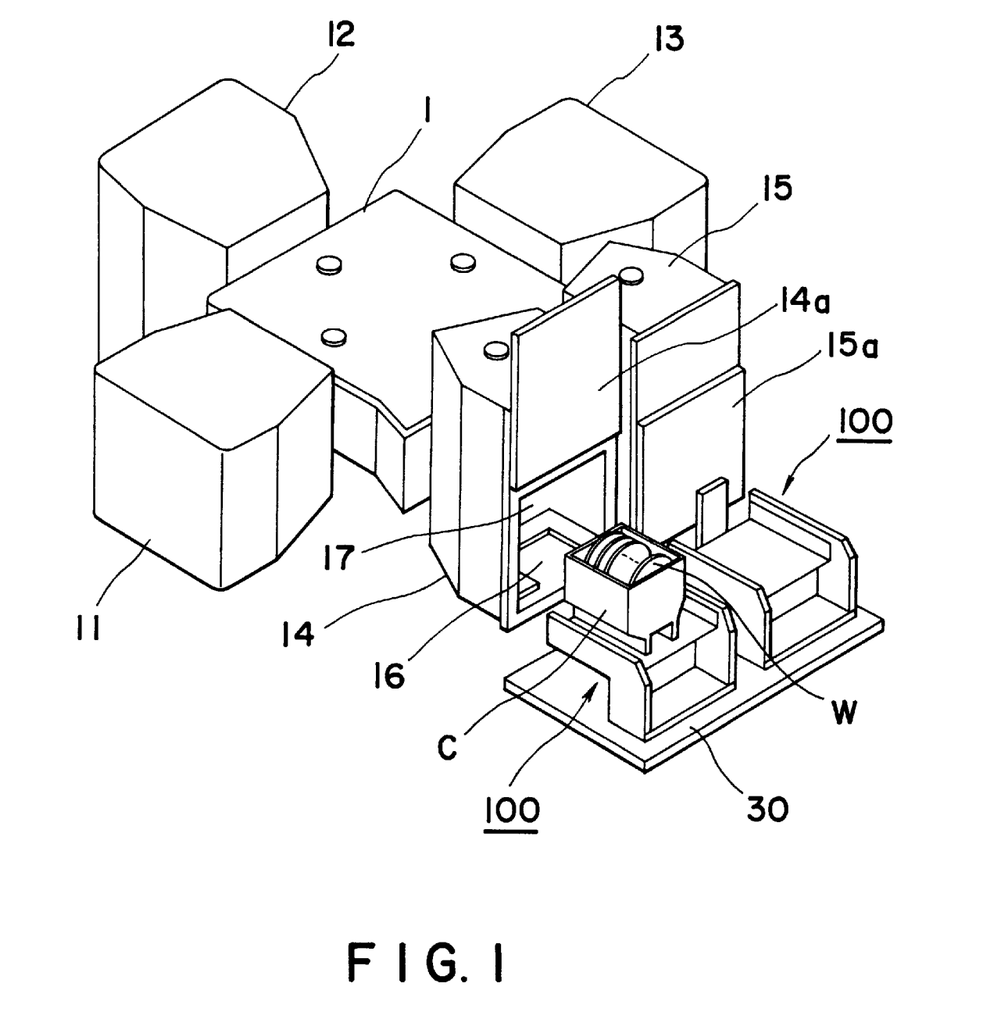
FIG. 1 is a schematic perspective view of a preferred embodiment of a wafer-cassette transfer system, according to the present invention, with a vacuum processing unit.

FIG. 1 is a schematic perspective view of the first preferred embodiment of a substrate-cassette carrying-in system, according to the present invention, which is combined with a cluster tool. In FIG. 1, reference number 1 denotes a transfer chamber. In the transfer chamber 1, a transfer arm (not shown) is arranged. To the transfer chamber 1, e.g., three vacuum processing chambers 11 through 13 and two cassette chambers 14 and 15 are airtightly connected.

The cassette chambers 14 and 15 are also called load-lock chambers, which are provided between the vacuum processing chambers and ambient atmosphere. The cassette chambers 14 and 15 have gate doors 14a and 15a for establishing and blocking a communication between the cassette chambers and the ambient atmosphere, respectively. Each of the gate doors 14a and 15a is moved upwards to open a transfer port (as shown by the gate door 14a), and downwards to close the transfer port (as shown by the gate door 15a). A mounting plate 16 for mounting a wafer cassette C thereon is provided in each of the cassette chambers 14 and 15. The mounting plate 16 is movable upwards and downwards by a lifting mechanism (not shown) so that wafers W in the wafer cassette C are sequentially positioned at a delivery position at which the wafers W are delivered to a transfer arm in the transfer chamber 1.

Outside the cassette chambers 14 and 15, a pair of cassette carrying-in systems 100 are provided so as to face cassette transfer ports 17 of the cassette chambers 14 and 15, respectively. Referring to FIGS. 2 through 7, the construction and operation of the cassette carrying-in system 100 will be described below.

The cassette carrying-in system 100 comprises a moving body 2 for moving the cassette C which holds therein, e.g., 25 wafers W arranged in parallel, and a guide rail 3 serving as a guiding track, which is arranged on the stage 30 (Shown in FIG. 1) for guiding the moving body 2 in forward and backward directions (i.e., in directions that the moving body 2 is approaching and leaving the cassette chamber 14 or 15).

The moving body 2 has a first support plate 41 serving as a first supporting portion. The front end of the support plate 41 (on the side of the cassette chambers 14 and 15) is supported on a substantially horizontal rotating shaft 50 between a pair of hook side plates 21 and 22. The first support plate 41 serves to support thereon the bottom portion of the cassette C (shown by the solid line in FIG. 1 and the chain line in FIG. 2), in which the wafers W are arranged substantially vertically. The first support plate 41 has a pair of guide portions 41a for laterally positioning the bottom of the cassette C. A second support plate 42 serving as a second supporting portion is fixed to the central portion of the front edge of the first support plate 41 so as to extend in a direction perpendicular to the first support plate 41.

Figure 2:
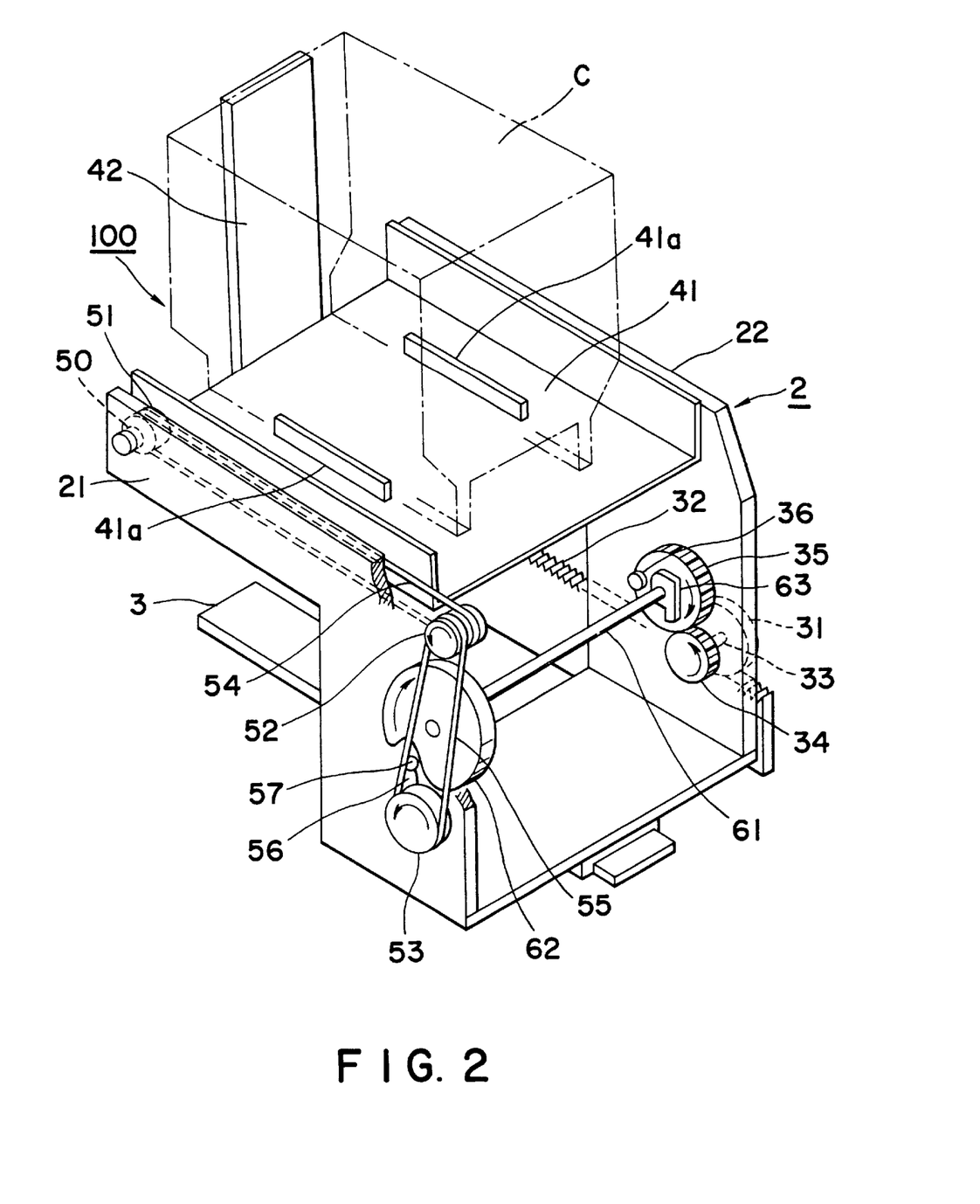
FIG. 2 is a partially-cut, perspective view of the preferred embodiment of a wafer-cassette transfer system, according to the present invention.

A first pulley 51 for rotating the first support plate 41 is provided at the front end portion of the side plate 21. Second and third pulleys 52 and 53, each of which rotates around a substantially horizontal shaft, are provided at the upper and lower portions of the rear end portion of the side plates 21, respectively. Belts 54 and 55 are wound onto the pulleys 51 and 52 and the pulleys 52 and 53, respectively, so that the rotation of the pulley 53 is transmitted to the pulley 51.

The pulley 53 is always biased clockwise in FIG. 2 (viewed from the side plate 21) by biasing means such as a coil spring (not shown). A cam floor 57 is mounted on the pulley 53 by means of a mounting member 56. The cam floor 57 comprises a roller which is rotatable about a horizontal shaft. Between the rear ends of the side plates 21 and 22, a horizontal rotating shaft 61 is provided. On one end of the rotating shaft 61, a first cam 62 for contacting the cam floor 57 to position the cam floor 57 is mounted. As can be clearly seen from FIG. 3, the first cam 62 has a shape formed by cutting a part of a complete round so as to have a cut-out portion 62a. The cut-out portion 62a is formed so that the distance between the center of the complete round and the cut-out portion 62a increases from one end to the other end of the cut-out portion 62a.

The cam floor 57 is positioned so as to contact one end of the cut-out portion 62a of the first cam 62 when the transfer system is positioned at an initial position, i.e., at a position at which the first support plate 41 is arranged substantially horizontally as shown in FIG. 2. Since the cam floor 57 is always biased clockwise via the pulley 53, the cam floor 57 is brought into tight contact with the peripheral surface of the first cam 62. Therefore, when the first cam 62 rotates clockwise (in the direction of arrow), the cam floor 57 rotates on its own axis and revolves counterclockwise around the central axis while the cam floor 57 contacts the cut-out portion 62a.

Figure 3:
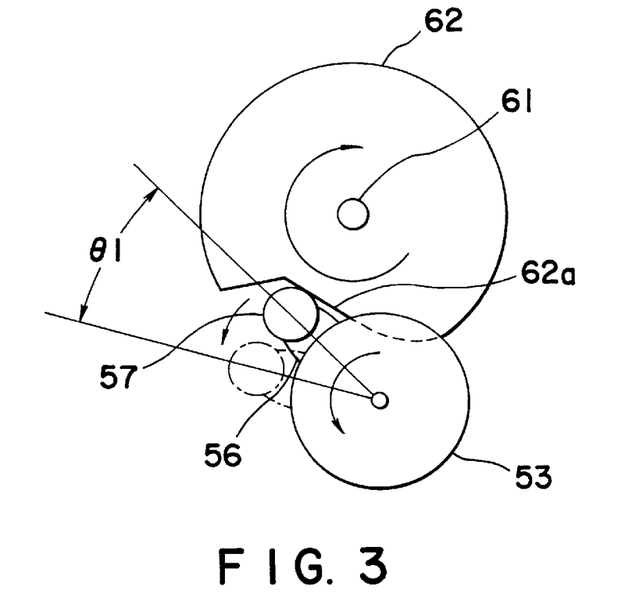
FIG. 3 is a side view of a part of a rotating mechanism for rotating a first support plate.
Figure 4:
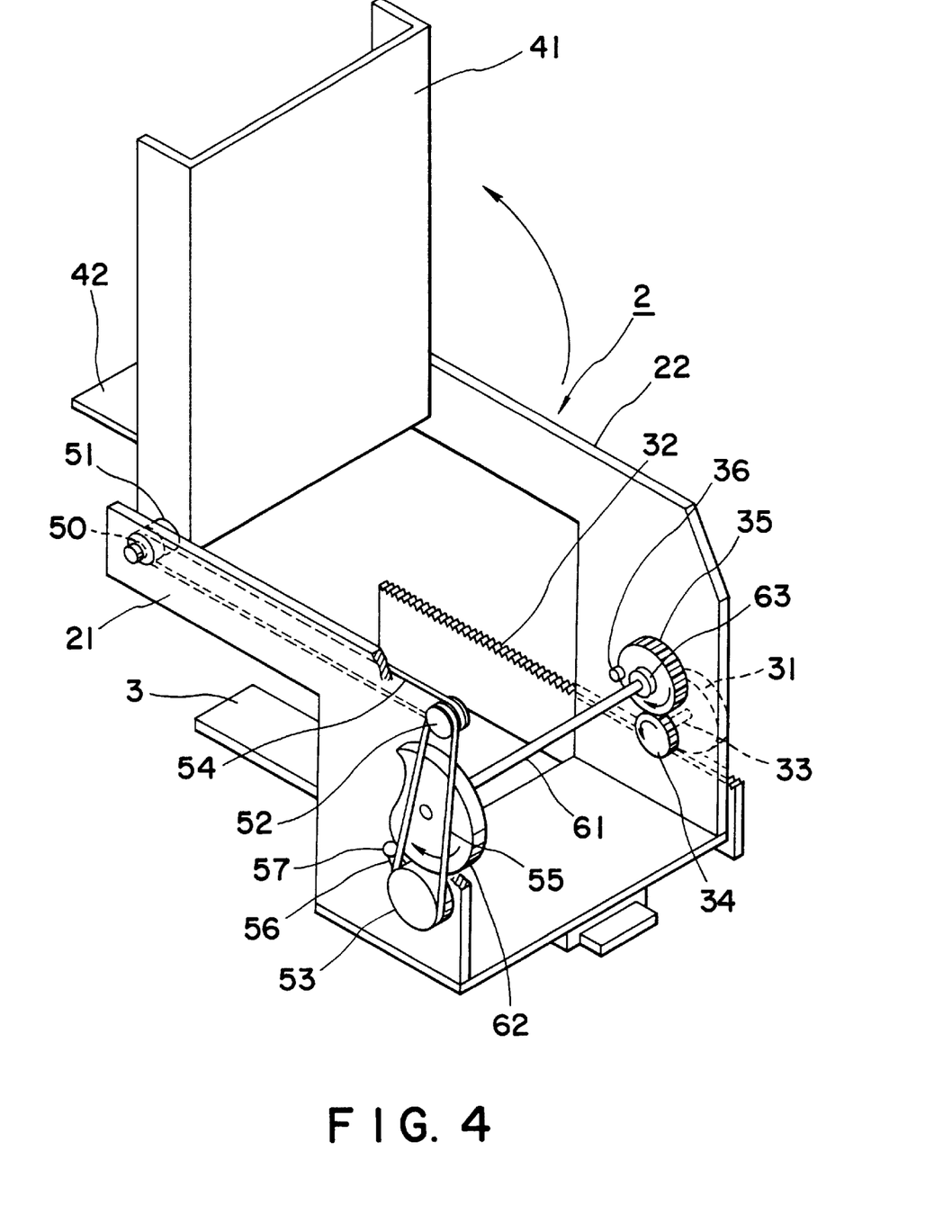
FIG. 4 is a perspective view of the wafer-cassette transfer system when the first support plate is rotated to rise.

Therefore, as shown in FIG. 3, the pulley 53 rotates counterclockwise by angle θ1, and the rotation thereof is transmitted to the first pulley 51 via the belts 53 and 54. Then, the support plates 41 and 42 rotate counterclockwise so that the support plate 41 rises as shown in FIG. 4. In this example, the first cam 62 and the cam floor 57 form a first cam mechanism, which sets the rotation timing of the rotation axis of the support plate 41.

After the first cam 62 further rotates clockwise, when the contact region of the cam floor 57 with the first cam 62 passes through the cut-out portion 62a to reach the complete round region, the revolving position of the cam floor 57 is not changed, so that the pulley 53 does not rotate. Thereafter, the clockwise rotation of the first cam 62 is converted into the driving force for causing the moving body 2 to travel along the guide rail 3.

The mechanism for running the moving body 2 will be described. As shown in FIGS. 2 and 4 through 6, outside the rear end of the other side plate 22, there is arranged a pinion 31 serving as a rotating body of the running mechanism, which rotates around a horizontal axis. The pinion 31 is designed to roll on a rack 32 serving as a part of a guiding track, which extends forwards and backwards, while engaging the rack 32. Inside a rotating shaft 33 of the pinion 31, a first gear 34 is provided. The first gear 34 engages a second gear 35.

The second gear 35 is rotatably supported on the side plate 22. A rotating shaft 61 of the first cam 62 passes through the second gear 35 so that the second gear 35 is rotatably supported thereon. On the other side of the rotating shaft 61, a second cam 63 is provided. On the second gear 35, a cam floor 36 is provided on a moving track of the second cam 63. The positions of the second cam 63 and the cam floor 36 are set so that when the first cam 62 reaches a rotational position at which the rotation of the third pulley 53 is completed (at which the cam floor 57 reaches the complete round region of the first cam 62), the second cam 63 contacts the cam floor 36, and thereafter, the second cam 63 rotates the second gear 35 clockwise via the cam floor 36 by the rotation of the first cam 62. In this example, the second cam 63 and the cam floor 36 form a second cam mechanism, which sets the rotation timing of the rotating shaft 33 of the pinion 31.

Figure 6:
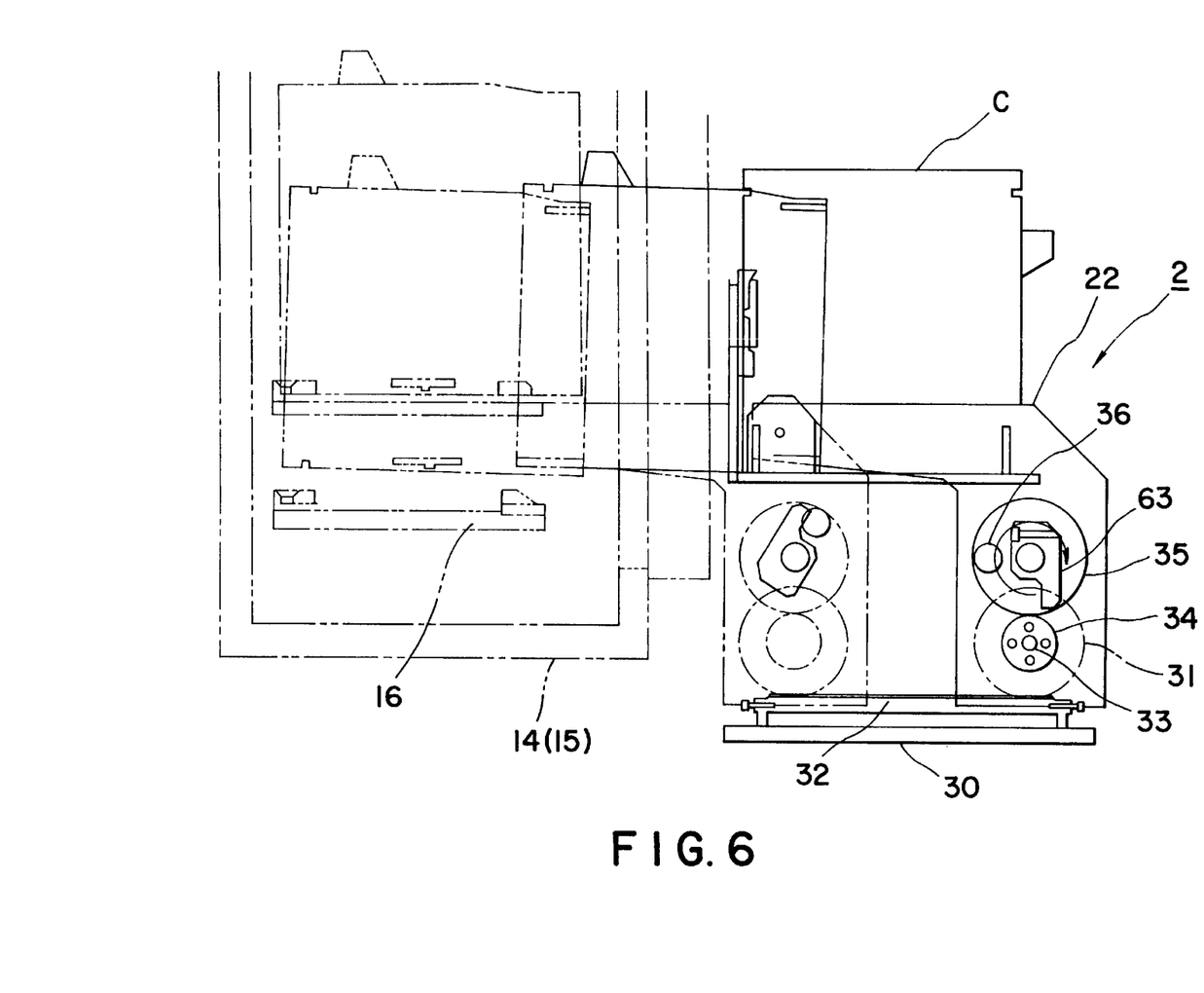
FIG. 6 is a side view of a part of the preferred embodiment of a wafer-cassette transfer system, according to the present invention.

The second gear 35 is biased by biasing means (not shown), such as a coil spring, so as to rotate counterclockwise toward the initial position shown in FIG. 6, so that the rotation position of the second gear 35 is surely regulated by the clockwise rotation of the second cam 63. When the second cam 63 rotates the second gear 35 clockwise via the cam floor 36, the pinion 31 rotates counterclockwise via the first gear 34 and rolls on the rack 32. Therefore, the moving body 2 moves forwards toward the cassette chamber 14 (15) while being guided by the guide rail 3 and the rack 32. In FIG. 6, the moving body 2 positioned at the initial position is shown by the solid line, and the moving body 2 positioned at the front position is shown by the two-dot chain line.

Figure 5:
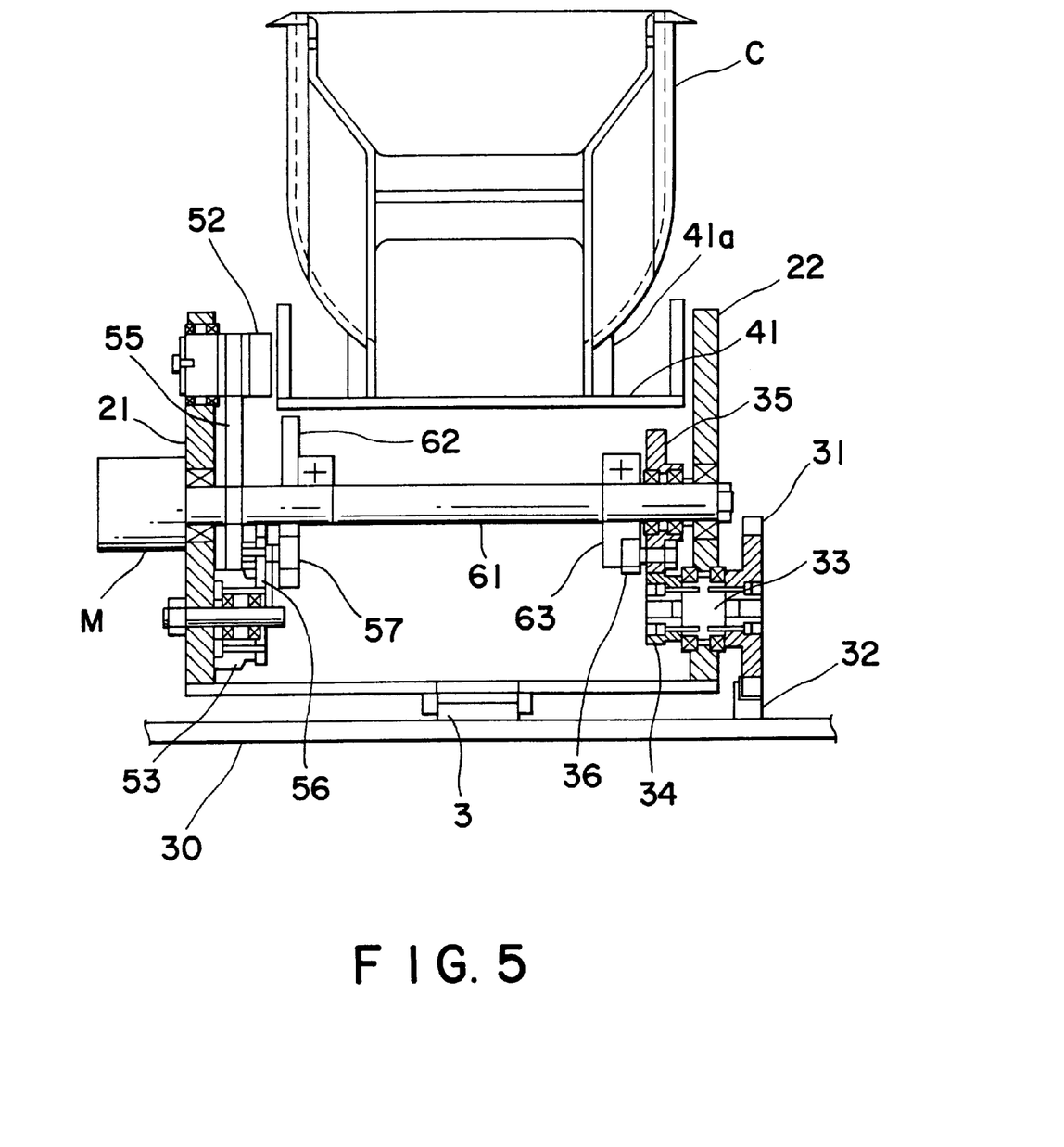
FIG. 5 is a front view of the preferred embodiment of a wafer-cassette transfer system, according to the present invention.

As a driving source for driving the first cam 62, e.g., a motor M is provided on the side plate 21 and connected to the rotating shaft 61 as shown in FIG. 5. In this case, the rotating shaft 50, the pulleys 51 through 53, the belts 54 and 55, the cam floor 57 and the first cam 62 forms a rotating mechanism for rotating the support plates 41 and 42. The pinion 31, the rack 32, the gears 33 and 35, the second cam 63 and the cam floor 36 form a running mechanism for the moving body 2. The shapes of the cams and the sizes of the pulleys may be suitably set. In the example as described above, e.g., the diameter of the pulleys and the gear ratios are set so that the rotating shafts 50 and 33 rotate sequentially by a predetermined angle when the first cam 62 rotates by 270 degrees.

With this construction, the operation of the wafer-cassette transfer system will be described below.

First, an operator sets the cassette C, which houses therein, e.g., 25 untreated wafers, on the first support plate 41 so that the wafers are arranged vertically (as shown by the solid lines in FIGS. 2 and 6). Subsequently, the motor M is driven, so that the rotating shaft 50 rotates counterclockwise by the rotation of the first cam 62 as described above. As a result, the first and second support plates 41 and 42 rotate forwards by about 90 degrees, and the cassette C rotates forwards as shown in FIGS. 4 and 6 while the side surface thereof is supported on the second support plate 42, so that the state of the wafers W is changed from the vertical state to a substantially horizontal state.

Figure 7:
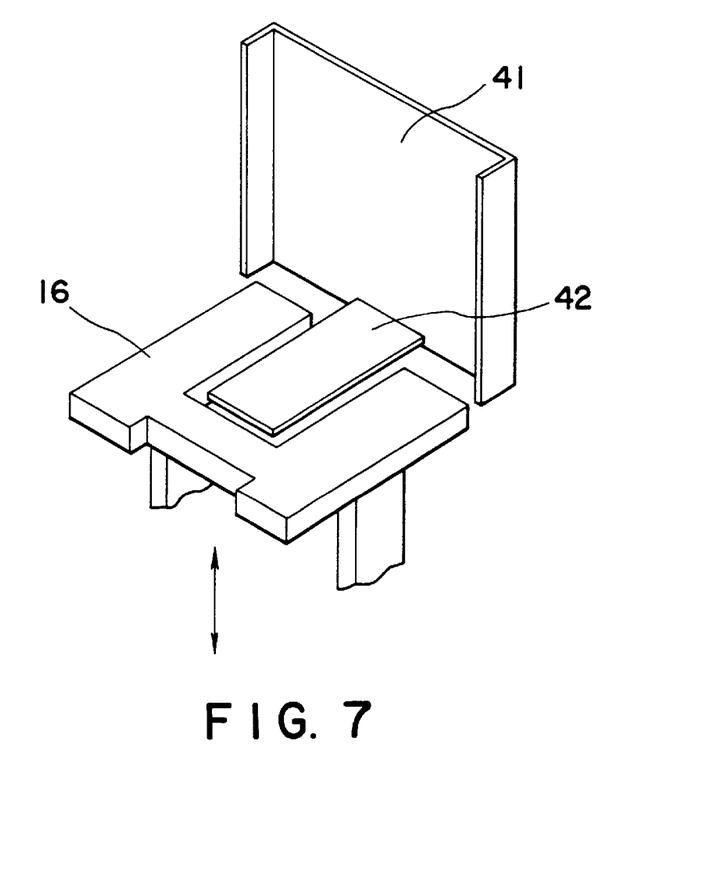
FIG. 7 is a perspective view of a mounting plate in a load-lock chamber.

When the rotating shaft 61 serving as a driving shaft further rotates clockwise, the transmission of the rotation of the first and second support plates to the rotating shaft is released, and the pinion 31 rotates on the rack 32, so that the moving body 2 moves forwards while being guided by the guide rail 3. The moving body 2 stops at a predetermined position. At this time, the mounting plate 16 in the load-lock chamber 14 (15) is positioned below the second support plate 42 supporting thereon the bottom of the cassette C. The shapes of the respective members are designed so that the mounting plate 16 and the second support plate 42 do not interfere with each other in a plane. That is, as shown in FIG. 7, the mounting plate 16 has a substantially U-shape so that the second support plate 42 is inserted into a central space of the mounting plate 16. Therefore, when the mounting plate 16 moves upwards, the cassette C is delivered from the support plate 42 to the mounting plate 16 without colliding with the second support plate 42.

On the other hand, the moving body 2 returns to the initial position by the reverse operation of the carrying in of the cassette C. After the gate doors 14a (15a) are closed to evacuate the load-lock chamber 14 (15) to a predetermined degree of vacuum, the gate valve between the transfer chamber 1 and the load-lock chamber 14 (15) is open. Then, the mounting plate 16 is intermittently moved, e.g., downwards from the upper limit position, and the wafers W in the cassette C are carried in the vacuum processing chamber 11, 12 or 13 by means of the transfer arm (not shown) in the transfer chamber 1, so that a predetermined vacuum processing of the wafers W is carried out. Both of the cassette chambers 14 and 15 may be used both for the carrying-in and carrying-out of the cassette C. Alternatively, one of the cassette chambers 14 and 15 may be used for the carrying-in of the cassette C, and the other may be used for the carrying-out of the cassette C. In a case where the cassette C housing therein the treated wafers W is carried out of the load-lock chamber 14 or 15, the cassette C is carried out of the load-lock chamber 14 or 15 by the reverse operation of that as described above to be returned to the initial position while the wafers W are arranged vertically.

According to the preferred embodiment as described above, the operator may only set the cassette C on the first support plate 41 while the wafers W are arranged vertically, and it is not required to rotate the cassette C. Therefore, excessive load is not the operator's wrist, so that there is no problem of human engineering. Since the cassette transfer system is separated from the load-lock chamber 14 (15), there is no influence on the structure of the gate door 14a (15a). Since the driving portion of the cassette transfer system is not introduced into the load-lock chamber 14 (15), it is possible to prevent contamination due to particles and lubricating oil from occurring. Since the rotation and carrying in of the cassette C are carried out using a common driving shaft associated with the cam mechanism, i.e., since the rotation and linear movement of the cassette are carried out by a single shaft, it is possible to manufacture the cassette transfer system with a simple structure to reduce costs.

In this preferred embodiment, while the moving body 2 has traveled after rotating the support plates 41 and 42 in order to carry the cassette C in the load-lock chamber 14 (15), the support plates 41 and 42 may be rotated after running the moving body 2, or the support plates 41 and 42 may be rotated while running the moving body 2.

That is, the rotation timings of the rotating shafts 61 and 33 may be set so that the rotations of the rotating shafts 61 and 33 are not temporally overlapped with each other as described above or so that the rotations of the rotating shafts 61 and 33 are temporally overlapped with each other.

In a case where the rotation timings are set so that the rotations of the rotating shafts 61 and 33 are not temporally overlapped, it is possible to decrease the region required for the rotational and translation movements of the cassette C. In a case where the rotation timings are set so that the rotations of the rotating shafts 61 and 33 are overlapped with each other, it is possible to simultaneously carry out the rotational and translation movements of the cassette C, so that it is possible to quickly carry the cassette C in the cassette chamber 14.

The processing unit, to which a cassette transfer system of the present invention is applied, should be limited to the vacuum processing unit. For example, in a case where a cassette is transferred from the outside to a cassette stage serving as an input-output port for the cassette, the cassette transfer system may be applied.

Figure 8:
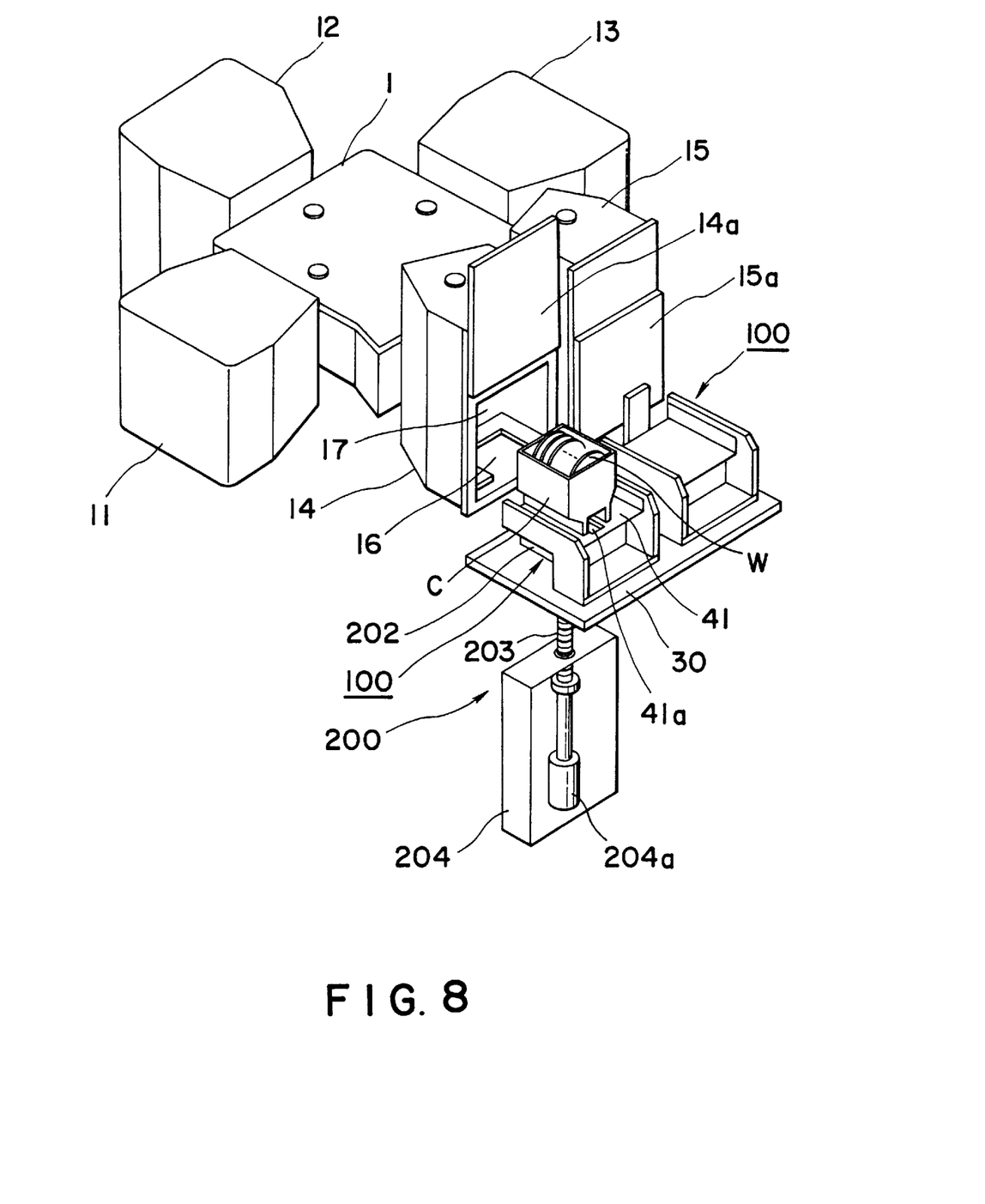
FIG. 8 is a schematic perspective view of another preferred embodiment of a wafer-cassette transfer system, according to the present invention, with a wafer preliminary-detection unit for making all of the uniform orientation flat of wafers in a wafer cassette and for counting the number of the wafers in the wafer cassette.
Figure 9:
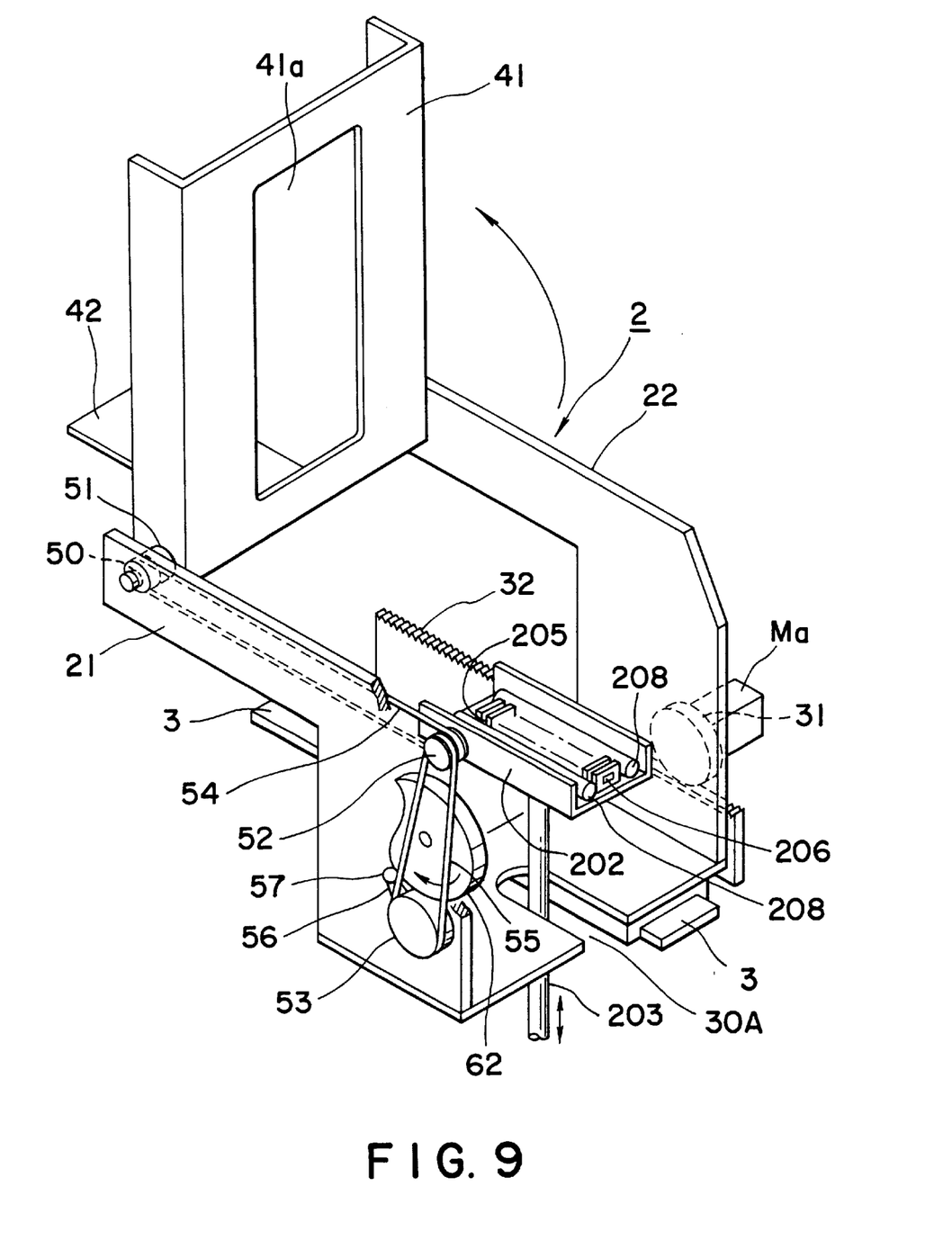
FIG. 9 is a perspective view of a wafer preliminary-detection system of a wafer-cassette transfer system.
Figure 10:
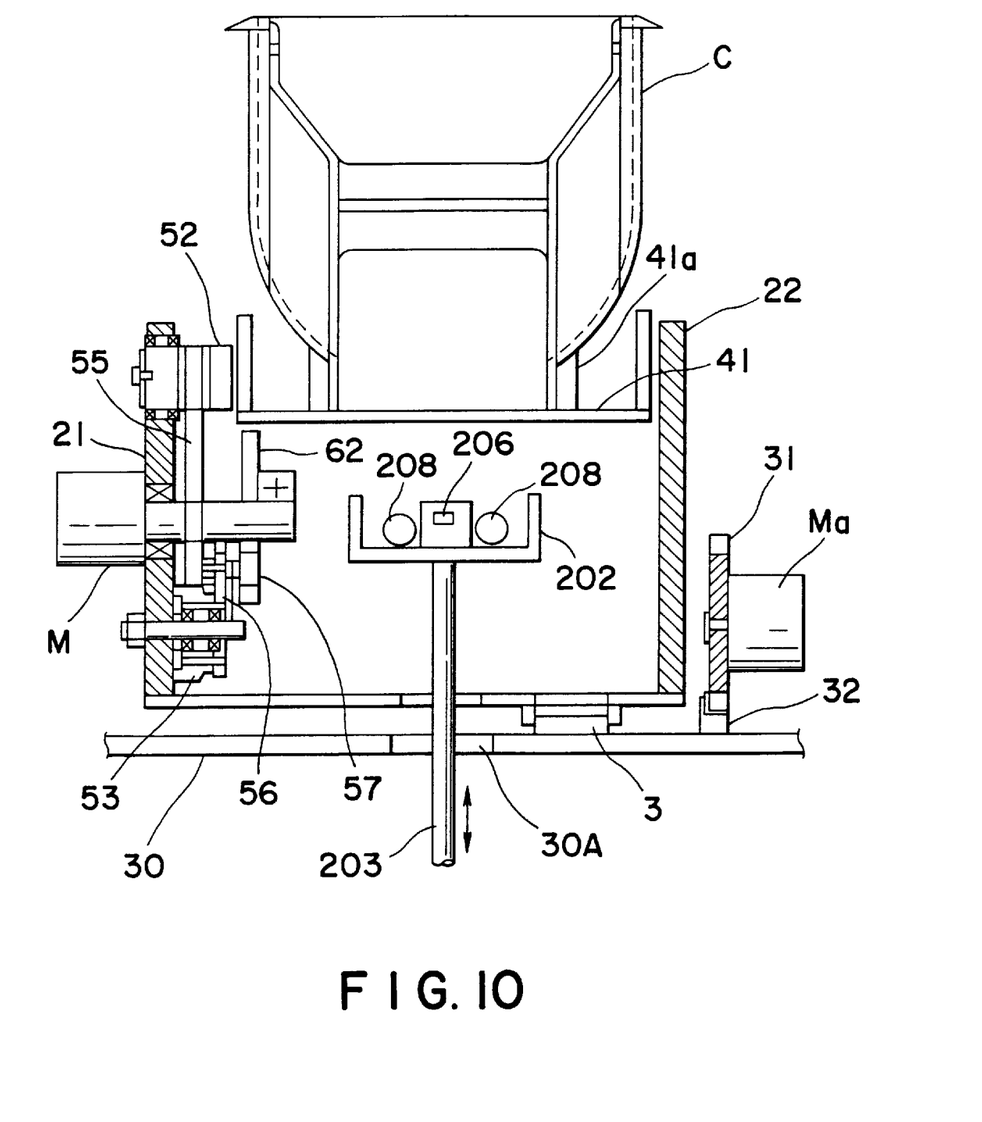
FIG. 10 is a front view of another preferred embodiment of a wafer-cassette transfer system, according to the present invention.

Referring to FIGS. 8 through 10, the second preferred embodiment of the present invention will be described below.

As shown in FIG. 8, below a first support plate 41, there is provided a preliminary treatment unit 200 for counting the number of substrates W to be processed in a cassette C and for making all of the uniform orientation of the substrates W in the cassette C in circumferential directions (e.g., in a direction of an orientation flat or a notch). The preliminary treatment unit 200 is substantially the same as that described in commonly-owned U.S. Pat. No. 5,183,373.

The central portion of the first support plate 41 is formed with an opening 41a. The cassette C straddles the opening 41a when the first support plate 41 supports thereon the cassette C so that the substrates W to be processed are arranged vertically therein.

The preliminary treatment unit 200 comprises a preliminary-unit head portion 202 which is capable of passing through the opening 41a to move upwards and downwards, and a preliminary-treatment driving portion 204 for moving the preliminary-unit head portion 202 upwards and downwards. The preliminary-unit head portion 202 is supported on the upper end portion of a supporting shaft 203 which is movable upwards and downwards. A stage 30 has a cut-out 30A, through which the supporting shaft 203 passes. The supporting shaft 203 passes through the cut-out 30A of the stage 30 to be movable upwards and downwards. The preliminary-treatment driving portion 204 moves the supporting shaft 203 upwards and downwards via a cylinder 204a and so forth.

The preliminary treatments for counting the number of the substrates W to be processed and for making all of the uniform orientation of the substrates W in circumferential directions are carried out by means of the preliminary treatment unit 200 while the substrates W to be processed are arranged vertically in the cassette C.

As shown in FIG. 9, the preliminary-unit head portion 202 comprises: counting means 206 for determining whether each of the substrates W to be processed is arranged in a corresponding one of a plurality of groove portions 205 formed in the cassette C; and two rollers 208, which extends in the arranging direction of the substrates to be processed, for rotating the substrates W while contacting the peripheries of the substrate W.

The counting means 206 comprises light emitting means and light receiving means, which are arranged on the sides of the substrates W to be processed, so as to clamp the substrates W. It is determined whether the light emitted from the light emitting means reaches the light receiving means, so that it is determined whether the substrates W to be processed are arranged in the grooves 205.

The rollers 208 rotates the substrates W to be processed while contacting the lower portions of the peripheries of the substrates W. When the rollers 208 meet the orientation flat or notch, the rollers 208 idle to make all of the uniform orientation of the substrates W in circumferential directions.

While the preliminary-unit head portion 202 shown in FIG. 9 has comprised the counting means 206 for counting the number of the substrates W to be processed and the rollers 208 for making all of the uniform orientation of the substrate W in circumferential directions, the preliminary-unit head portion 202 may comprise only one of the counting means 206 and the rollers 208.

In the second preferred embodiment, the pinion 31 is driven by means of a motor Ma independent of a motor M. In addition, no rotating shaft 61 is provided, and the driving timings of the motors M and Ma are controlled by means of an electric control section (not shown).

In this preferred embodiment, the preliminary treatment unit 200 is provided. Therefore, before the cassette C is transferred to the cassette chamber 14 by means of the transfer system 100 or after the cassette C leaving the cassette chamber 15 is transferred by means of the transfer system 100, a preliminary treatment for counting the number of the substrates W in the cassette C or for making all of the uniform orientation of the substrates W in the cassette C in circumferential directions can be carried out.

Furthermore, to drive the pinion 31 by means of the motor Ma independent of the motor M may be applied to the first preferred embodiment.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A cassette carrying-in system for carrying a cassette, in which a plurality of substrates to be processed are arranged in parallel, in combination with a processing unit for treating the substrates, said cassette carrying-in system comprising:
   a moving body having a first supporting portion for holding a bottom portion of said cassette so that said substrates to be processed are arranged vertically, and a second supporting portion which is rotatable with said first supporting portion and which supports thereon a side of said cassette when said cassette is inclined, said second supporting portion supporting thereon said side serving as a bottom of said cassette when said substrates to be processed are arranged horizontally;
   a rotating mechanism for rotating of said first and second supporting portions so that said substrates in said cassette are changed between a vertical state and a horizontal state; and
   a running mechanism for running said moving body so that said cassette supported on said first and second supporting portions move between positions which are inside and outside said processing unit;
   said rotating mechanism and said running mechanism being located outside of said processing unit.

2. The cassette carrying in system according to claim 1, wherein said rotating mechanism comprises a rotating shaft for rotating said first and second supporting portions and a driving shaft for rotating said rotating shaft, and wherein said running mechanism comprises a rotating body which rolls on a guiding track to run said moving body, the rotation of said driving shaft being transmitted to said rotating shaft of said rotating mechanism and a rotating shaft of said rotating body.

3. The cassette carrying-in system according to claim 2, which further comprises a first cam mechanism for transmitting the rotation of said driving shaft to said rotating shaft of said rotating body of said rotating mechanism, and a second cam mechanism for transmitting the rotation of said driving shaft to said rotating shaft of said running mechanism, said rotating shafts having rotation timings set by said first and second mechanisms.

4. The cassette carrying-in system according to claim 3, wherein said rotation timings of said rotating shafts are set so as to prevent the rotations of said rotating shafts of said rotating mechanism and said rotating body from temporally overlapping with each other.

5. The cassette carrying-in system according to claim 3, wherein said rotation timings of said rotating shafts are set so that the rotations of said rotating shafts of said rotating mechanism and said rotating body temporally overlap with each other.

6. The cassette carrying-in system according to claim 1, wherein said rotating mechanism comprises a rotating shaft for rotating said first and second supporting portions and a driving shaft for rotating said rotating shaft, and wherein said running mechanism comprises a rotating body which rolls on a guiding track to run said moving body, said driving shaft and a rotating shaft of said rotating body being driven by means of separate driving sources.

7. The cassette carrying-in system according to claim 1, wherein said processing unit has a mounting plate, which is movable upwards and downwards and which stands by at a lower position than said second supporting portion when said second supporting portion is carried therein, said mounting plate being prevented from interfering with the movement of said second supporting portion in a plane when said second supporting portion is carried in said processing unit, said cassette supported on said second supporting portion being delivered by upward movement of said mounting plate.

8. The cassette carrying-in system according to claim 1, wherein said processing unit comprises a vacuum processing chamber for vacuum-processing said substrates to be processed, and a load-lock chamber provided between said vacuum processing chamber and the outside, said cassette being carried from the outside of said load-lock chamber to the inside of said load-lock chamber by means of said moving body.

9. The cassette carrying-in system according to claim 1, wherein said first supporting portion has an opening, said first supporting portion being capable of holding said cassette, in which said substrates to be processed are arranged vertically, so that said cassette straddles said opening, and wherein a counting preliminary-treatment unit for counting the number of said substrates in said cassette is arranged below said first supporting portion, said counting preliminary-treatment unit having a counting preliminary-treatment head portion which is capable of passing through said opening to move upwards and downwards, said counting preliminary-treatment head portion having counting means for determining whether each of said substrates to be processed is arranged in a corresponding one of a plurality of groove portions formed in said cassette.

10. The cassette carrying-in system according to claim 1, wherein said first supporting portion has an opening, said first supporting portion being capable of holding said cassette, in which said substrates to be processed are arranged vertically, so that said cassette straddles said opening, and wherein an orientation preliminary-treatment unit for uniformly orienting said substrates in said cassette in circumferential directions is arranged below said first supporting portion, said orientation preliminary-treatment unit having an orientation preliminary-treatment head portion which is capable of passing through said opening to move upwards and downwards, said orientation preliminary-treatment head portion having a roller, which extends in an arranging direction of said substrates and which rotates said substrates while contacting lower portions of peripheries of said substrates.

11. The cassette carrying-in system according to claim 1, wherein said first supporting portion has an opening, said first supporting portion being capable of holding said cassette, in which said substrates to be processed are arranged vertically, so that said cassette straddles said opening, and wherein a preliminary-treatment unit for counting the number of said substrates in said cassette and for uniformly orienting said substrates in said cassette in circumferential directions is arranged below said first supporting portion, said preliminary-treatment unit having a preliminary-treatment head portion which is capable of passing through said opening to move upwards and downwards, said preliminary-treatment head portion having counting means for determining whether each of said substrate is arranged in a corresponding one of a plurality of groove portions formed in said cassette, and a roller, which extends in an arranging direction of said substrates and which rotates said substrates while contacting lower portions of peripheries of said substrates.

12. A cassette carrying-in system for carrying a cassette, in which a plurality of substrates to be processed are arranged in parallel, in combination with a processing unit for treating the substrates, said cassette carrying-in system comprising:

a moving body having a first supporting portion for holding a bottom portion of said cassette so that said substrates to be processed are arranged vertically, and a second supporting portion which is rotatable with said first supporting portion and which supports thereon a side of said cassette when said cassette is inclined, said second supporting portion supporting thereon said side serving as a bottom of said cassette when said substrates to be processed are arranged horizontally;

a rotating mechanism for rotating of said first and second supporting portions so that said substrates in said cassette are changed between a vertical state and a horizontal state; and a running mechanism for running said moving body so that said cassette supported on said first and second supporting portions move between inside and outside said processing unit;

said rotating mechanism including a rotating shaft for rotating said first and second supporting portions and a driving shaft for rotating said rotating shaft, said running mechanism including a rotating body which rolls on a guiding track to run said moving body, the rotation of said driving shaft being transmitted to said rotating shaft of said rotation mechanism and a rotating shaft of said rotating body.

13. The cassette carrying-in system according to claim 12, which further comprises a first cam mechanism for transmitting the rotation of said driving shaft to said rotating shaft of said rotating body of said rotating mechanism, and a second cam mechanism for transmitting the rotation of said driving shaft to said rotating shaft of said running mechanism, said rotating shafts having rotation timings set by said first and second cam mechanisms.

14. The cassette carrying-in system according to claim 13, wherein said rotation timings of said rotating shafts are set so as to prevent the rotations of said rotating shafts of said rotating mechanism and said rotating body from temporally overlapping with each other.

15. The cassette carrying-in system according to claim 13, wherein said rotation timings of said rotating shafts are set so that the rotations of said rotating shafts of said rotating mechanism and said rotating body temporally overlap with each other.

16. A cassette carrying-in system for carrying a cassette, in which a plurality of substrates to be processed are arranged in parallel, in combination with a processing unit for treating the substrates, said cassette carrying-in system comprising:

a moving body having a first supporting portion for holding a bottom portion of said cassette so that said substrates to be processed are arranged vertically, and a second supporting portion which is rotatable with said first supporting portion and which supports thereon a side of said cassette when said cassette is inclined, said second supporting portion supporting thereon said side serving as a bottom of said cassette when said substrates to be processed are arranged horizontally;

a rotating mechanism for rotating of said first and second supporting portions so that said substrates in said cassette are changed between a vertical state and a horizontal state; and a running mechanism for running said moving body so that said cassette supported on said first and second supporting portions move between positions which are inside and outside said processing unit;

said rotating mechanism including a rotating shaft for rotating said first and second supporting portions and a driving shaft for rotating said rotating shaft, said running mechanism including a rotating body which rolls on a guiding track to run said moving body, said driving shaft and a rotating shaft of said rotating body being driven by means of separate driving sources.

* * * * *